United States Patent [19]

Stelzenmuller et al.

[11] 3,985,968

[45] Oct. 12, 1976

[54] MULTIPLEX DATA COMMUNICATIONS USING ACOUSTICAL SURFACE WAVE FILTERS

[75] Inventors: William K. Stelzenmuller, Poughkeepsie; Ernest L. Walker, Wappingers Falls, both of N.Y.

[73] Assignee: International Business Machines Corporation, Armonk, N.Y.

[22] Filed: Jan. 9, 1975

[21] Appl. No.: 539,673

[52] U.S. Cl................................ 179/15 BC; 333/72
[51] Int. Cl.²........................ H03H 7/10; H04J 1/00
[58] Field of Search............ 333/70 S, 10, 11, 2 VR, 333/29, 70 R, 72; 179/15 AP, 15 BC, 15 AC

[56] References Cited
UNITED STATES PATENTS

| | | | |
|---|---|---|---|
| 3,358,082 | 12/1967 | Helm | 179/15 BC |
| 3,358,083 | 12/1967 | Helm | 179/15 BC |
| 3,766,496 | 10/1973 | Whitehouse | 333/72 |
| 3,836,876 | 9/1974 | Marshall | 333/72 |
| 3,858,118 | 12/1974 | Daniel | 333/72 |

*Primary Examiner*—Kathleen H. Claffy
*Assistant Examiner*—E. Matt Kemeny
*Attorney, Agent, or Firm*—Harold H. Sweeney, Jr.

[57] ABSTRACT

An acoustical wave filter is formed by depositing a pattern of interdigitated conductors which form a coding arrangement on a piezoelectric crystal. Multiplex communication through the crystal is achieved by depositing input filters of differing configuration on the crystals, which separate channels by autocorrelation of a pulse code. A single output filter is provided to respond to the waves set up in the crystal by the input filters to transmit these waves to a single common conductor. Demultiplex is similarly done on a second crystal.

10 Claims, 13 Drawing Figures

FIG. 1
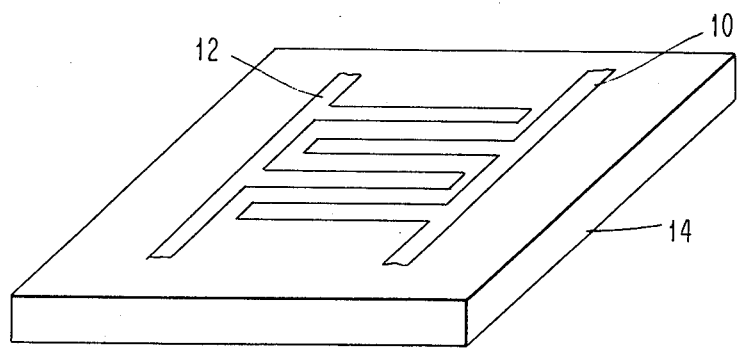
FIG. 2a   FIG. 2b   FIG. 2c
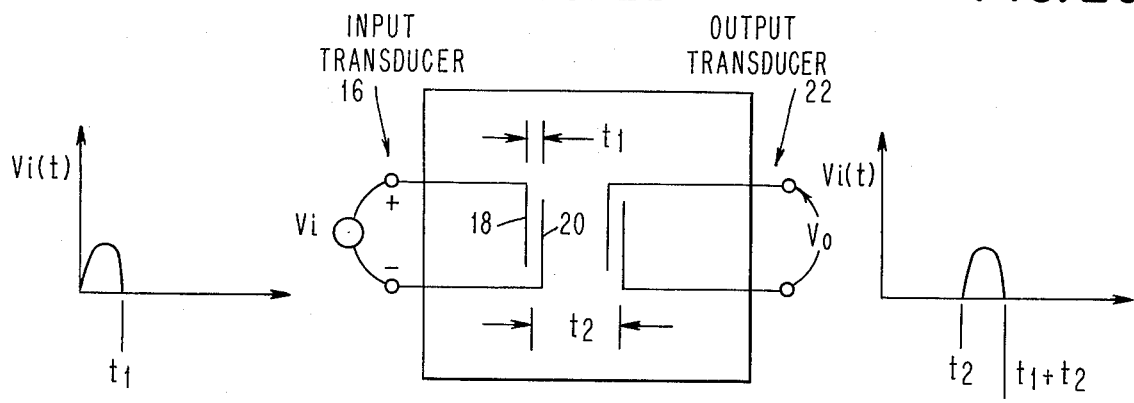

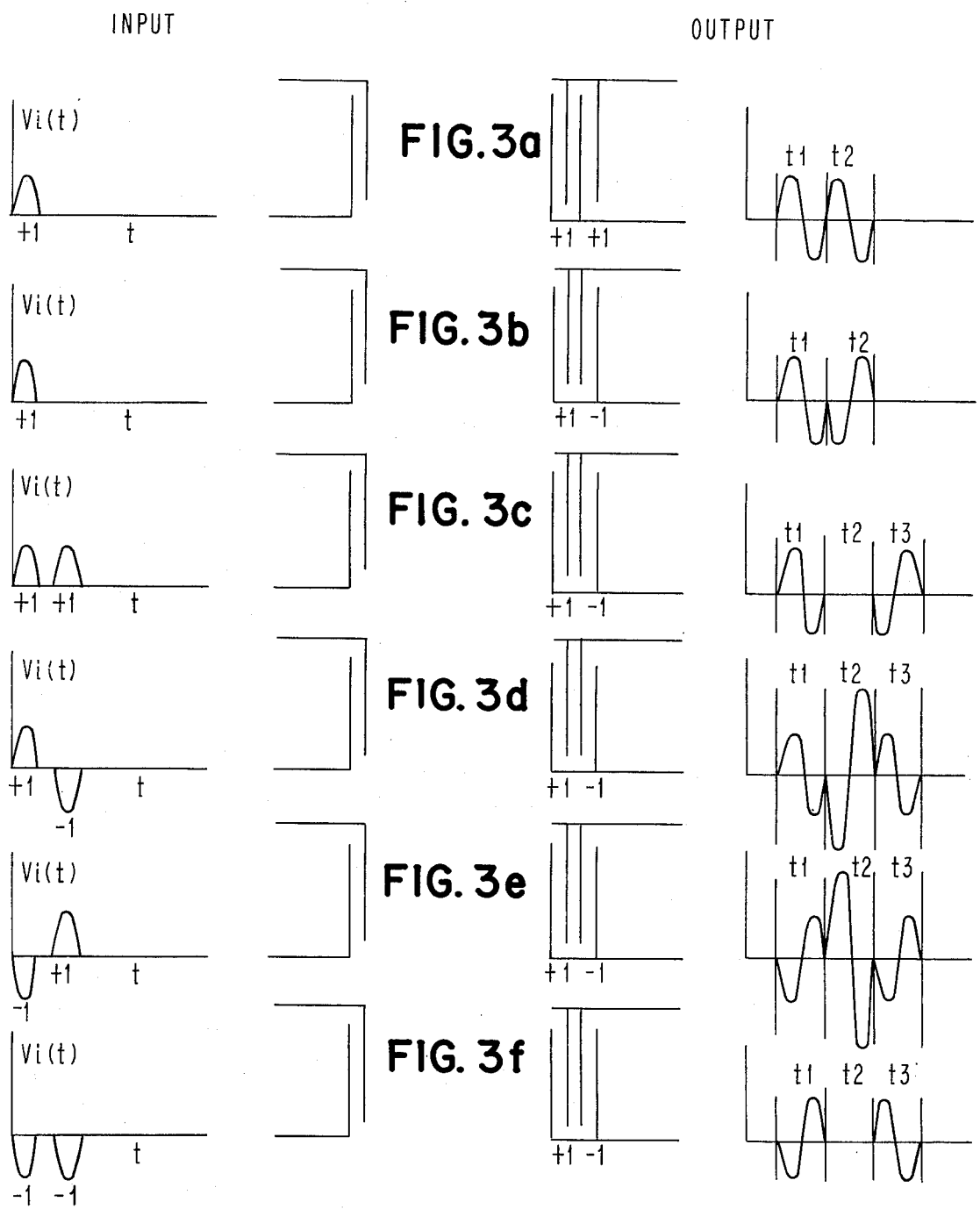

MULTIPLEX DATA COMMUNICATIONS USING ACOUSTICAL SURFACE WAVE FILTERS

BACKGROUND OF THE INVENTION

1. Field of the Invention

The present invention relates to data transmission systems and more particularly to data transmission systems using surface wave filter devices which encode data prior to transmission and decode data in the receiver to recover the original information.

2. Description of the Prior Art

Systems are well known in the prior art wherein matched filters are used to encode data for transmission and for decoding the data with a similar matched filter to recover the original data. The use of matched filters allows the simultaneous transmission of the data without interference.

It is also well known that acoustic surface wave filters can be used as matched filters in such a system. However, in the prior art a pulse code modulator is used to multiplex the signals received from the acoustic surface wave filter to thereby concentrate the signals onto a single coaxial cable for transmission. A pulse code demodulator at the receiving end transforms the signal and deserializes it for presentation to each of the matched filters in sequence. The prior art does not teach how to use an acoustic surface wave filter device as a multiplexor and demultiplexor.

It is, therefore, an object of this invention to utilize an acoustic surface wave filter device to perform matched filtering (encoding/decoding), in a multiple channel simultaneous communication system.

It is a further object of this invention to provide an acoustic surface wave device which transmits and receives digital information from any combination of data communication channels in a bi-lateral direction, simultaneously, over a single transmission line.

The above objects of the invention are realized by the discovery of a set of codes that have good self-correlation (a signal sequence autocorrelated with its matching filter) and poor cross autocorrelation (a signal sequence autocorrelated with a non-matching filter). Furthermore, the codes are chosen such that the superposition of any combination of codes form a resultant code that causes true autocorrelation in the proper filters and rejection by all other filters.

One embodiment of the invention comprises a matched filter for each input channel deposited upon an appropriate acoustic surface. The acoustic waves set up by each filter from its corresponding channel is multiplexed into a common cable by a single output transducer associated with the acoustic surface which receives the waves and sums the waves into a single output.

The transmitted pulses are inversely transformed to recover the original signals by means of a second acoustic surface wave device which is a mirror image of the first acoustic surface wave device. That is, the second device has a receiver for receiving the signals transmitted on the cable and to thereby set up in the second acoustic surface wave device a signal which is identical to the composite signal set up by the plurality of channels in the first device. This complex signal is demultiplexed by means of matched filters corresponding to each channel which are the mirror image of the matched filters on the input acoustic device.

A clocking channel is further provided in the form of a matched filter on the input and output acoustic device to carry clocking information.

The invention has the advantage that is useful in the area of I/0 bound functions, such as, board-to-board wiring in computer systems wherein there is a limitation, due to compact integrated circuitry, as to the number of output pins that are available.

The invention also has the advantage that it allows encoding and decoding of simultaneously transmitted information.

The invention has the advantage that multiple signals can be transmitted over a single cable with a minimum of sensitivity to noise and inter-channel crosstalk.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 1 is a perspective drawing of an acoustical surface wave filter formed by depositing a pattern of interdigital conductors on top of a piezeoelectric crystal.

FIGS. 2a–c are a schematic diagram and wave form of an input transducer and an output transducer of a typical acoustic surface wave design.

FIGS. 3a–f are timing diagrams of various configurations of acoustic wave transducers and receivers illustrating the response to various input signal sequences and various filter patterns.

DETAILED DESCRIPTION

Figure 4:
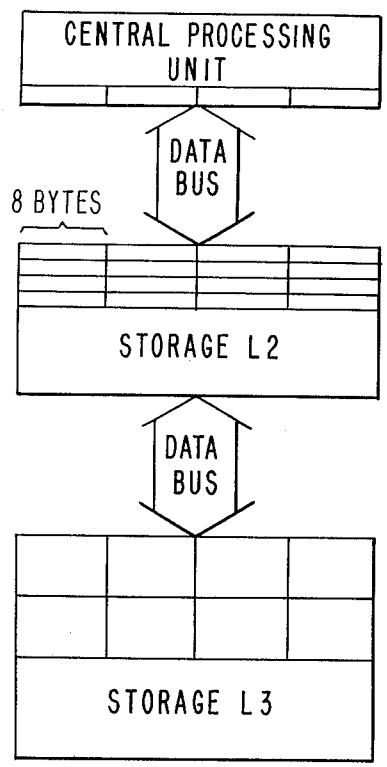
FIG. 4 is a block schematic diagram of a typical computer system in which the invention finds use.

Referring to FIG. 1, an acoustical surface wave filter is formed by depositing a pattern of interdigital conductors 10, 12 on top of a piezoelectric crystal 14 such as quartz, or lithium niobate. The simplest filter consists of two pairs of interdigital conductors (fingers) which form input and output transducers (a group of finger pairs).

FIG. 2 shows an input transducer 16 being excited by a voltage $V_i$. An electric field is applied across the fingers 18, 20 and in turn develops a physical distortion at the surface of the crystal. This distortion (acoustic source) propagates along the crystal surface (much like a water wave) in the ±Z directions. When the +Z component of the transmitted wave reaches the output transducer 22, a voltage $V_0$ is developed at the output terminals due to the electric field accompanying the acoustic wave.

FIG. 3a shows the output if two pairs of fingers are put on the output transducer with the same phase relationship, and FIG. 3b shows the output when these two finger pairs are 180° out of phase. FIGS. 3c through 3f show the output transducer responses by the filter in FIG. 3b to various input signal sequences. Note that the outputs in 3d and 3e give responses in the center lobe that are twice the side lobe responses.

The cases shown in FIGS. 3d and 3e will be called the true and complement autocorrelation lobes. Note that the input sequence from the input transducer in FIG.

3d is 1, -1 and the coding of the output transducer is 1, -1 while the input sequence in 3e is -1, 1. Therefore, when the input code (sequence) matches the output transducer, (filter) then true autocorrelation results, and when the input code is the complement of the output transducer, the results will be complement autocorrelation. These basic concepts are exploited by the present invention to develop a system of coded channels to achieve multi-channel communications.

Refer now to FIG. 4. In large computer systems, it is frequently required that large amounts of data (several hundred bytes) by moved between devices. One of the places in which this is done is between the central processing unit (CPU), and other levels of memory hierarchy. FIG. 4 shows a simplified model of such a hierarchical memory organization. The bus width (8 bytes) between the levels of memory play an important role in the overall performance of the system. When a request is made by the CPU for data in storage level $L_2$, a much larger amount of data is sent by $L_2$ than required by the CPU. Since the number of bytes of information sent to the CPU must be transmitted over a limited bus width (usually 8 bytes), several cycles are required to complete the operation. If the bus could carry four times as much data per cycle, the performance of the system would be greatly enhanced.

Figure 5:
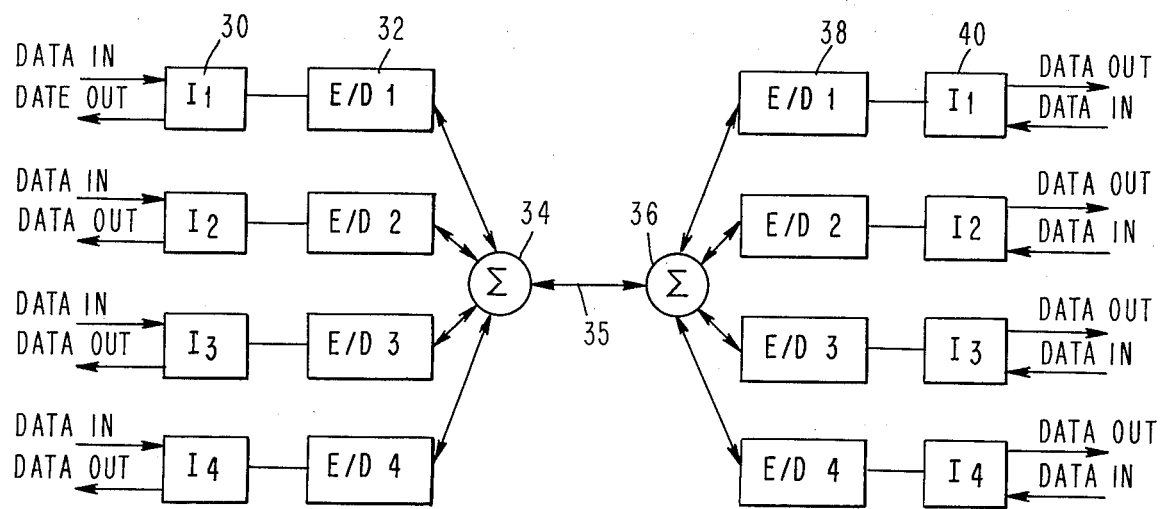
FIG. 5 is a block schematic diagram of a two-way, four channel, data communications system.

Due to the realization of the ASW device as a relatively inexpensive way to perform matched filtering (encoding/decoding), multiple channel, simultaneous, communications is made possible. FIG. 5 shows a two-way, four-channel, data communications link. The requirements of the link are as follows:

1. To transmit and receive digital information from any combination of the four channels in either direction, (and only those channels) over a single line.
2. Transmission or reception of all chemicals must be simultaneous (no serializing).

To meet the above requirements, it is necessary to find a set of codes that have good self-autocorrelation (a signal sequence autocorrelated with its matching filter), and poor cross autocorrelation (a signal sequence autocorrelated with a non-matching filter). In addition, in order for all channels to be sent or received within the same cycle time, it is necessary that the superposition of any combination of codes formed a resultant code that causes true autocorrelation in the proper filters, and rejection by all other filters.

Such a set of codes have been discovered for any number of channels that is a multiple of four. For four channels the codes are; (1, −1, −1, −1), (−1, 1, −1, −1), (−1, −1, 1, −1) and (−1, −1, −1, 1). Rewriting these codes in matrix form yields;

$$M = \begin{bmatrix} 1 & -1 & -1 & -1 \\ -1 & 1 & -1 & -1 \\ -1 & -1 & 1 & -1 \\ -1 & -1 & -1 & 1 \end{bmatrix}$$

Now we define the following matrices $S_1 = M$, $F = M^T$ (M transposed) and $C_1 = SF$ (matrix product). Therefore, we get for $C_1$ $$C_1 = \begin{bmatrix} 4 & 0 & 0 & 0 \\ 0 & 4 & 0 & 0 \\ 0 & 0 & 4 & 0 \\ 0 & 0 & 0 & 4 \end{bmatrix}$$

where $S_1$ is the signal matrix of each channel transmitted separately, F is the filter matrix, and $C_1$ is the true autocorrelation matrix. If the rows of $C_1$ are interpreted as signal sequence numbers (i), and the columns of $C_1$ are interpreted as the filter numbers (j), it is easy to see that the true autocorrelation of each signal with the filter of the same number ($i = j$) is four, and zero for all others ($i \ne j$). Now, let us extend these definitions to the more general case where multiple channels are transmitted simultaneously.

Now define $C_n = S_n F$, where $S_n$ is the signal matrix of all combinations of n channels being transmitted simultaneously. Therefore, $S_1$ is as previously explained and the remaining S's are;

$$S_2 = \begin{bmatrix} 0 & 0 & -2 & -2 \\ 0 & -2 & 0 & -2 \\ 0 & -2 & -2 & 0 \\ -2 & 0 & 0 & -2 \\ -2 & 0 & -2 & 0 \\ -2 & -2 & 0 & 0 \end{bmatrix} \quad S_3 = \begin{bmatrix} -1 & -1 & -1 & -3 \\ -1 & -1 & -3 & -1 \\ -1 & -3 & -1 & -1 \\ -3 & -1 & -1 & -1 \end{bmatrix}$$

$$S_4 = [-2 \quad -2 \quad -2 \quad -2]$$

and the resulting C's are $$C_2 = \begin{bmatrix} 4 & 4 & 0 & 0 \\ 4 & 0 & 4 & 0 \\ 4 & 0 & 0 & 4 \\ 0 & 4 & 4 & 0 \\ 0 & 4 & 0 & 4 \\ 0 & 0 & 4 & 4 \end{bmatrix} \quad C_3 = \begin{bmatrix} 4 & 4 & 4 & 0 \\ 4 & 4 & 0 & 4 \\ 4 & 0 & 4 & 4 \\ 0 & 4 & 4 & 4 \end{bmatrix}$$

$$C_4 = [4 \quad 4 \quad 4 \quad 4]$$

These matrices show that any combination of transmitted channels will be received correctly.

It should be pointed out that $C_n$ is the value of the output of the filter at the center term in the autocorrelated sequence. The side lobes on each channel, in general, are very high and could give a false result if the interface circuits are allowed to see these side lobes. To eliminate this problem, the interface circuits must be clocked to gate the interface on and off at the proper times.

The clocking function is achieved by adding another channel to carry the clock signal. The clock code is chosen to be a Barker code, see communications theory edited by Willis Jackson, published by Butterworths Scientific Publications, London, 1953, Chapter 19, Page 273, titled Group Synchronizing of Binary Digital Systems by R. H. Barker. Since the clock code is not a member of the set of codes previously described for the data channels, it will not obey the superposition and autocorrelation requirements met by that set. To facilitate the transmission of the clock code, the frequency of the data channel codes are made an interger multiple of the frequency of the clock code. This would make all signals arriving at the clock filter, sent by the data channels filters, to develop no voltage in the clock channel.

To show the clock in the system in matrix form, the clock code will be shown to be at the end of each row of the $S_n$ and F matrices.

The new matrices would look like this.

$$S_1 = \begin{bmatrix} 1 & -1 & -1 & -1 & A \\ -1 & -0 & -1 & -1 & A \\ -1 & -1 & 1 & -1 & A \\ -1 & -1 & -1 & 1 & A \end{bmatrix} \quad S_2 = \begin{bmatrix} 0 & 0 & -2 & -2 & A \\ 0 & -2 & 0 & -2 & A \\ 0 & -2 & -2 & 0 & A \\ -2 & 0 & 0 & -2 & A \\ -2 & 0 & -2 & 0 & A \\ -2 & -2 & 0 & 0 & A \end{bmatrix}$$

$$S_3 = \begin{bmatrix} -1 & -1 & -1 & -3 & A \\ -1 & -1 & -3 & -1 & A \\ -1 & -3 & -1 & -1 & A \\ -3 & -1 & -1 & -1 & A \end{bmatrix}$$

$$S_4 = [-2 \quad -2 \quad -2 \quad -2 \quad A]$$

$$F = \begin{bmatrix} 0 & 0 & 0 & 0 & A \\ 1 & -1 & -1 & -1 & 0 \\ -1 & 1 & -1 & -1 & 0 \\ -1 & -1 & 1 & -1 & 0 \\ -1 & -1 & -1 & 1 & 0 \end{bmatrix}$$

$$C_1 = \begin{bmatrix} A^2 & 4 & 0 & 0 & 0 \\ A^2 & 0 & 4 & 0 & 0 \\ A^2 & 0 & 0 & 4 & 0 \\ A^2 & 0 & 0 & 0 & 4 \end{bmatrix}$$

A is the Barker sequence with an arbitrary amplitude of K units. The required amplitude of A will be determined later. Note that $C_1$ is the same as before with the addition of the clock autocorrelation column. This is true for the rest of the $C_n$'s. The new interpretation of $C_1$ is that the clock filter (first column) gives true autocorrelation with all sequences with a value of $A^2$ at the same time true autocorrelation in the data channels occurs.

If $A = K, K, -K$ (three bit Barker with amplitude K), then we want $A^2 = A \times A^T = 4$ because the detector circuits would be the same for clock and data channels. Therefore, $$A \times A^T = [K \; K \; -K] \begin{bmatrix} K \\ K \\ -K \end{bmatrix} = 3K^2$$

From a knowledge of Barker codes, we know that the highest side of lobe is $K^2$, giving a three to one signal to noise ratio. Now, going back to finding the required value of $A^2$;

$$3K^2 = 4$$

or $$K = 2/\sqrt{3}$$

Figure 6:
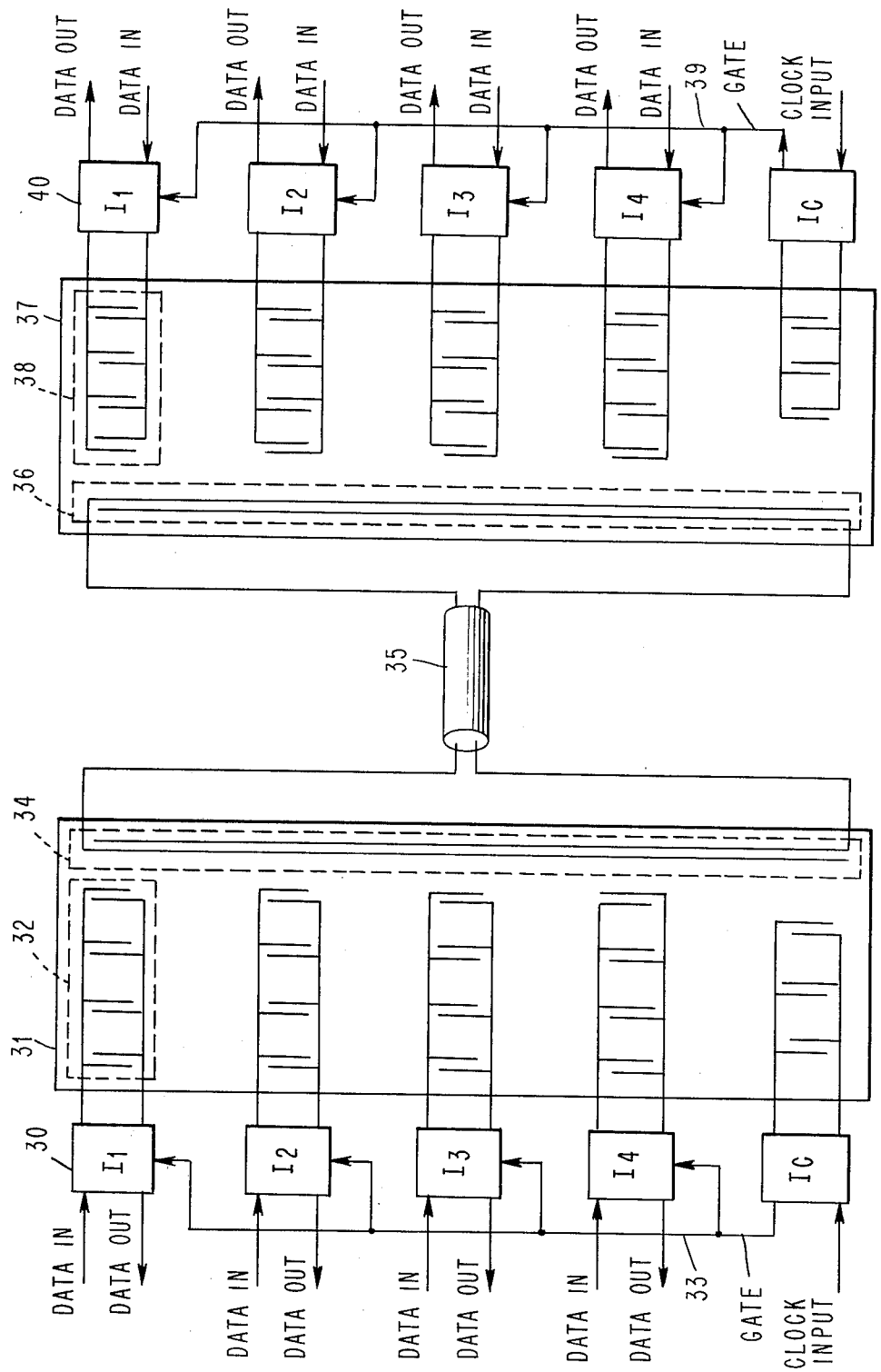
FIG. 6 is a block schematic diagram implementing the system described in FIG. 5 by use of acoustic surface wave devices.

FIG. 6 summarizes the system and shows the personalization of the filters including the clock channel.

A plurality of interface drivers and receivers $I_1 - I_4$ receive and send data to and from a first source of information. Each driver is associated with an interdigital filter 32 which is deposited on an appropriate substrate 31. A common output filter 34 is provided on the first substrate 31 to concentrate acoustic surface waves into a common cable 35 which connects the first substrate with a second substrate 37. Deposited on the second substrate is a common filter 36 and a plurality of filters 38 associated with appropriate output interface drivers 40. Also provided is a clock receiver/driver $I_c$ which receives a clock input on each substrate and generates a gating signal 33 for substrate 31 and gating signal 39 for substrate 37. This clocking signal may be used to energize the interface drivers to provide synchronization between the two substrates. For example, data received on the data-in line to interface driver 30 drives filter 32 and causes acoustic surface waves to be set up in the substrate 31. These waves are transmitted through the substrate and received by the first output encode/decode filter 34 which drives the cable 35. The cable 35 interconnects the first substrate 31 with the second substrate 37. The filters deposited on the substrate 37 are a mirror image of those deposited on the substrate 31. The second output encode/decode filter 36 receives the signal and sets up an acoustic surface wave in the substrate 37 which is substantially identical to the wave set up for the same signal in substrate 31. Only one of the matched filters on the substrate 37 will be matched to the code of the filter 32. This filter is 38 and because of its pattern is a mirror image of the filter 32 and the signal sequence transmitted autocorrelates with this matching filter and is rejected by all the other matching filters. Therefore, an output occurs in interface driver 40 corresponding to the input received initially by interface driver 30. This is true so long as the set of codes is within the class of codes previously described.

While the invention has been particularly shown and described with reference to a preferred embodiment thereof, it will be understood by those skilled in the arts that the foregoing and other changes in form and details may be made therein without departing from the spirit and scope of the invention.

What is claimed is:

1. A data transmission system for transmitting information contained in one or more message signals over a common transmission medium between a transmitting station and a receiving station comprising:

first multiplexing/demultiplexing means comprising a plurality of acoustic surface wave (ASW) filters deposited on a first substrate for receiving message signals from respective message signal sources to thereby set up acoustic surface waves in said substrate;

coding means for coding said plurality of acoustic surface wave filters so that the acoustic surface waves induced in said substrate are likewise coded;

an output filter deposited on said first substrate for receiving said coded acoustic surface waves to thereby convert said waves to an electrical signal which is a summation of the individual waves for transmission over a common transmission medium to said receiving station;

second multiplexing/demultiplexing means comprising an input filter deposited on a second substrate for receiving said summation electrical signal and for inducing in said second substrate a composite acoustical surface wave which is the acoustical equivalent of said summation electrical signal;

and a further plurality of coded acoustical surface wave filters deposited on said second substrate which are a mirror image of said plurality of coded filters deposited on said first substrate to thereby decode said composite acoustical waves into electrical message signals having information identical to the information contained in said message signals received by said first substrate.

2. The combination according to claim 1 wherein gating means are included between said message signal sources and said plurality of acoustic surface wave filters, and wherein at least one of said plurality of acoustic surface wave filters is used for receiving clocking information which is used to energize said gates to provide synchronization between said first and second substrates.

3. For use in a data transmission system for transmitting information contained in one or more message signals between a transmitting station and a receiving station, a multiplexing/demultiplexing device comprising:

a plurality of acoustic surface waves (ASW) filters deposited on a substrate for receiving message signals from respective message signal sources to thereby set up acoustic surface waves in said substrate;

coding means for coding said plurality of acoustic surface wave filters so that the acoustic surface waves induced in said substrate are likewise coded; and an output filter deposited on said first substrate for receiving said coded acoustic surface waves to thereby convert said waves to an electrical signal which is a sum composite of said plurality of acoustic surface waves for transmission over a common transmission medium to said receiving station.

4. A data transmission system for transmitting information contained in one or more message signals over a common transmission medium between a first station and a second station comprising:

a plurality of interface receivers/drivers at each of said first and second stations, for receiving data from and sending data to a plurality of sources, first multiplexing/demultiplexing means comprising a plurality of acoustic surface waves (ASW) filters deposited on a first substrate for receiving message signals from said interface receivers/drivers to thereby set up acoustic surface waves in said substrate; coding means for coding said plurality of acoustic surface wave filters so that the acoustic surface waves induced in said substrate by energizing said acoustic surface wave filters are likewise coded;

an output filter deposited on said first substrate for receiving said acoustic surface waves to thereby convert said waves to a composite electrical signal for transmission over a common transmission medium to said second station;

second multiplexing/demultiplexing means comprising an input filter deposited on a second substrate for receiving said composite electrical signal and for inducing in said second substrate a wave which is a sum composite of the waves induced in said first substrate;

and a further plurality of acoustical surface wave filters deposited on said second substrate and connected to said interface receivers/drivers at said second station, which further filters are a mirror image of said plurality of filters deposited on said first substrate to thereby transform said composite acoustical waves into electrical signals having the same information as said first electrical signals received by said first substrate.

5. The combination according to claim 4 wherein gating means are included within said interface receivers/drivers, and wherein at least one of said plurality of acoustic surface wave filters is used for receiving clocking information which is used to energize said gates to provide synchronization between said first and second substrates.

6. A data transmission system according to claim 1 wherein said plurality of acoustic surface wave filters each comprise four pairs of interdigitated conductive fingers, three pairs of which have the same orientation to give the same signal phase, and one pair of which has the opposite orientation to give the opposite signal phase.

7. A data transmission system according to claim 6, wherein said coding means comprises a different one of the four pairs of interdigitated conductive fingers oriented oppositely to the others in each of said plurality of acoustic surface wave filters to thereby provide a different acoustical surface wave sequence for each of said acoustic surface wave filters which when summed together into said composite electrical signal by said output filter for transmission over a single transmission medium can be decoded to obtain the original information signals.

8. A data transmission system according to claim 1, wherein said coding means for coding said plurality of acoustic surface wave filters is applicable to any number of surface wave filters which is a multiple of 4.

9. A data transmission system according to claim 2, wherein said one of said plurality of acoustic surface wave filters which is used to receive clocking information to energize said gates is coded with a Barker code.

10. A data transmission system according to claim 9, wherein the coded plurality of message signals have a frequency which is an interger multiple of the frequency of said coded clocking information.

* * * * *